United States Patent [19]

Shimazaki

[11] Patent Number: 4,954,780
[45] Date of Patent: Sep. 4, 1990

[54] SCAN CONTROLLER FOR NMR IMAGING DEVICE

[75] Inventor: Toru Shimazaki, Tokyo, Japan

[73] Assignee: Yokogawa Medical Systems, Limited, Tokyo, Japan

[21] Appl. No.: 397,402

[22] Filed: Aug. 23, 1989

Related U.S. Application Data

[63] Continuation-in-part of Ser. No. 251,226, Jul. 22, 1988, abandoned.

[30] Foreign Application Priority Data

Jan. 29, 1986 [JP]   Japan ................................. 61-17371

[51] Int. Cl.[5] ........................................... G01R 33/20
[52] U.S. Cl. .................................................. 324/318
[58] Field of Search ............... 324/307, 309, 314, 318, 324/322

[56] References Cited

U.S. PATENT DOCUMENTS

| 4,254,778 | 3/1981 | Clow et al. | 324/309 |
| 4,300,096 | 11/1981 | Harrison et al. | 324/309 |
| 4,355,282 | 10/1982 | Young et al. | 324/309 |
| 4,361,807 | 11/1982 | Burl et al. | 324/309 |
| 4,379,262 | 4/1983 | Young | 324/309 |
| 4,651,097 | 3/1987 | Iwaoka et al. | 324/309 |
| 4,694,254 | 9/1987 | Vatis et al. | 324/322 |

FOREIGN PATENT DOCUMENTS

| 78338 | 5/1985 | Japan . |
| 80747 | 5/1985 | Japan . |
| 82841 | 5/1985 | Japan . |
| 242352 | 12/1985 | Japan . |

Primary Examiner—Hezron E. Williams
Assistant Examiner—Kevin D. O'Shea
Attorney, Agent, or Firm—Moonray Kojima

[57] ABSTRACT

A scan controller for an NMR imaging device, wherein the scan controller stores control signal waveforms in a waveform memory; stores control signal amplitudes in an amplitude memory; stores data related to the control signal duration in a time memory; reads the waveform memory by using an address counter which operates based on data read out from the time memory and outputs the waveform memory read out value after conversion to analog. The amplitude of the control signal is multiplied by the waveform of the control signal and converted from digital data to analog so that the resulting amplitude is related to the amplitude of the signal stored in the amplitude memory. In this manner high amplitude resolution is attained and requirement for large scale memory capacity is reduced.

4 Claims, 4 Drawing Sheets

SCAN CONTROLLER FOR NMR IMAGING DEVICE

RELATED APPLICATION

This is a continuation-in-part of Ser. No. 251,226 filed July 22, 1988, now abandoned.

BACKGROUND OF THE INVENTION.

1. Field of Invention.

This invention relates to an improved scan controller for imaging devices that acquire tomographic images of a subject by using nuclear magnetic resonance (NMR); and more particulary, to such a scan controller having an improved memory performance for scan control signals.

2. Description of the Prior Art.

The NMR imaging device comprises a magnetic assembly including a static magnetic field coil to generate a uniform static magnetic field, and a gradient magnetic field coil to generate in the same magnetic field as the static magnetic field straight and gradient magnetic fields in the X, Y, and Z directions. Also included are transmitting and receiving sections to detect NMR signals from the subject by applying a high-frequency radio frequency (RF) pulse to the magnetic field generated by the magnetic assembly, and a control and image processing section to control the transmitting/receiving sections and magnetic assembly, and process the detected data for image display.

When controlled by the control and image processing section, this NMR imaging device sequentially outputs high-frequency pulses based on the Saturation Recovery (SR) method or the Inversion Reconvery (IR) method. The control and image processing sections also control the magnetic assembly and transmitting/receiving sections to restore images through sequential data collection based for example, on the Fourier analysis.

The control and image processing section is usually equipped with a scan controller. The scan controller generates a gradient magnetic field and a high-frequency pulse according to the respective operation sequences of the magnetic assembly and transmitting-/receiving section. Control signals, used to generate the gradient magnetic field and high-frequency pulse according to desired sequences, are stored in advance, and are read out to execute the desired sequences. Stored control signals have different waveforms, amplitudes, and durations, according to the type of desired sequence.

Therefore, the scan controller requires a large memory capacity to store the numerous consecutive control signals. Furthermore, to enhance the resolution of the control signal amplitude, the digital data must contain a large number of bits to express the amplitude. This, in turn, increases the need for a larger memory capacity.

SUMMARY OF THE INVENTION.

An object of the invention is to provide a scan controller for an NMR imaging device which is capable of storing control signals of high amplitude resolution for various desired sequences with use of only a small memory capacity.

Another object is to provide a scan controller for NMR imaging devices which can randomly assemble desired sequences.

The foregoing and other objects are attained by the invention which encompasses a scan controller which stores (1) the waveforms of control signals in a waveform memory; (2) the amplitudes of the control signals in an amplitude memory; and (3) specified durations of control signals in a time memory, in the order of the desired sequence of events.

The scan controller reads out the waveform memory with the use of an address counter which is operated on the basis of a clock signal determined by a value read out from the time memory. The scan controller converts the output from the waveform memory into an analog signal using a first D/A (digital to analog) converter. The output from the amplitude memory is applied to a second D/A converter for analog conversion. The analog output from the second D/A converter is applied as a base level signal to the first D/A converter so that the amplitude of the analog signal output from the first D/A converter is determined by the amplitude of the signal stored in the amplitude memory, the analog output signal from the first D/A converter being proportional to the output signal from the waveform memory multiplied by the analog output from the second D/A converter.

In the foregoing manner, the invention advantageously enables various control and other signals to perform their respective functions without the requirement of a large capacity of the memory.

DETAILED DESCRIPTION OF THE PREFERRED EMBODIMENTS.

Figure 1:
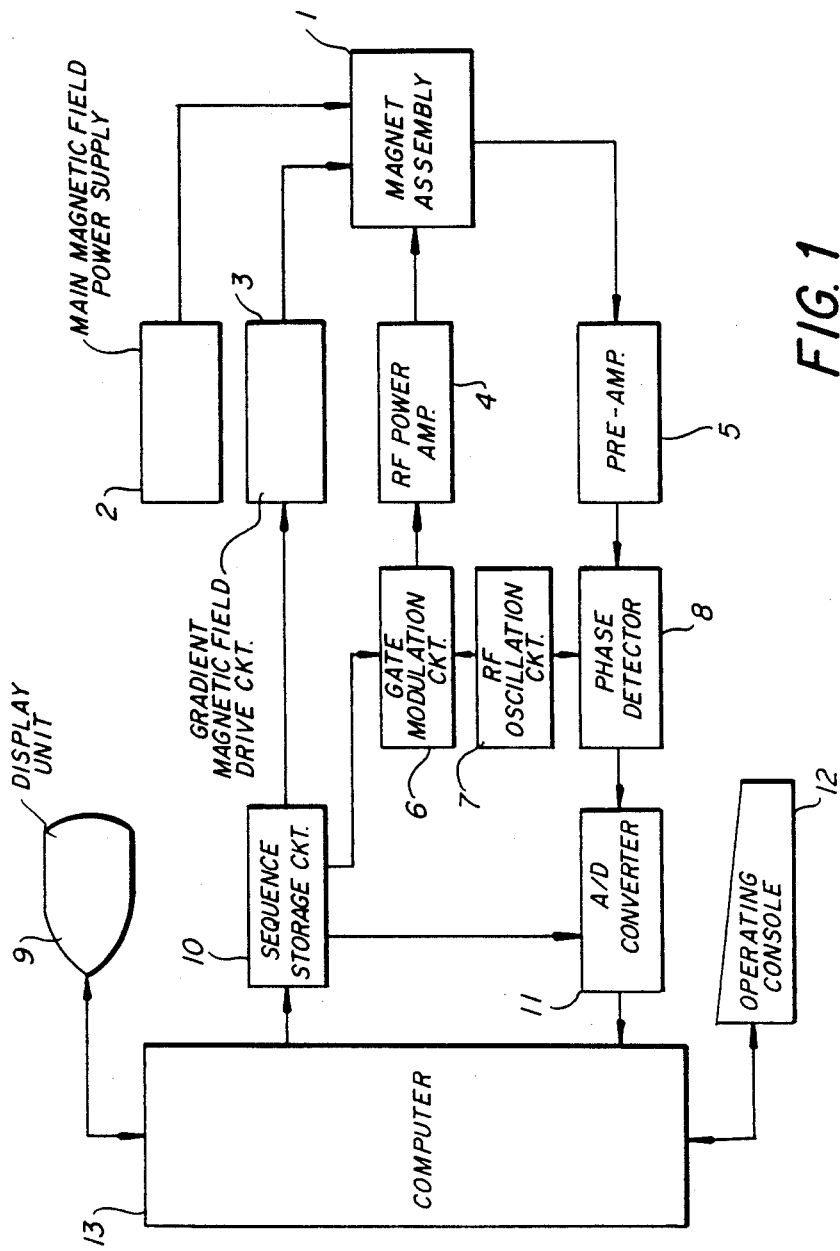
FIG. 1 is a block diagram depicting an NMR imaging device using the scan controller of the invention.

FIG. 1 depicts a magnetic assembly 1 which has an internal space section (not specifically depicted) for inserting a subject to be examined. This space is surrounded by a static magnetic field coil which applies a fixed static magnetic field to the subJect; X, Y, and Z gradient magnetic field coils which generate gradient magnetic fields; an RF transmitting coil which provides high-frequency pulses for exciting nuclear spin inside the subJect; and a receiving coil which detects NMR signals from the subject. (These coils are not depicted for sake of clarity of description). The static magnetic field coil, gradient magnetic field coils, RF transmitting coil, and receiving coil are respectively connected to a main magnetic field power supply 2, gradient magnetic field drive circuit 3, RF power amplifier 4, and preamplifier 5. Sequence storage circuit 10 operates gradient magnetic field drive circuit 3, gate modulation circuit 6 and A/D (analog to digital) converter 11 according to instructions issued from a computer 13 in a preset sequence. An NMR signal of the subJect is detected by the receiving coil of the magnetic assembly, then preamplified by pre-amplifier 5, and then outputted to phase detector 8, which phase detects the pre-amplified NMR signal.

Phase detector 8, in response to an output signal from RF oscillation circuit 7, provides A/D converter 11 with the phase detected NMR signal. A/D converter 11 then applies to computer 13 the NMR signal after analog-to-digital conversion. Computer 13 exchanges data between operating console 12 and switches the operation of sequence storage circuit 10 or reloads various memories therein to set various scan sequences. Computer 13 also uses data sent from the A/D converter 11 to execute and carry out operations for reconfiguring the distribution of resonance energy information into images, and outputs the reconfigured image data to display unit 9 for visual display, for example.

Figure 2:
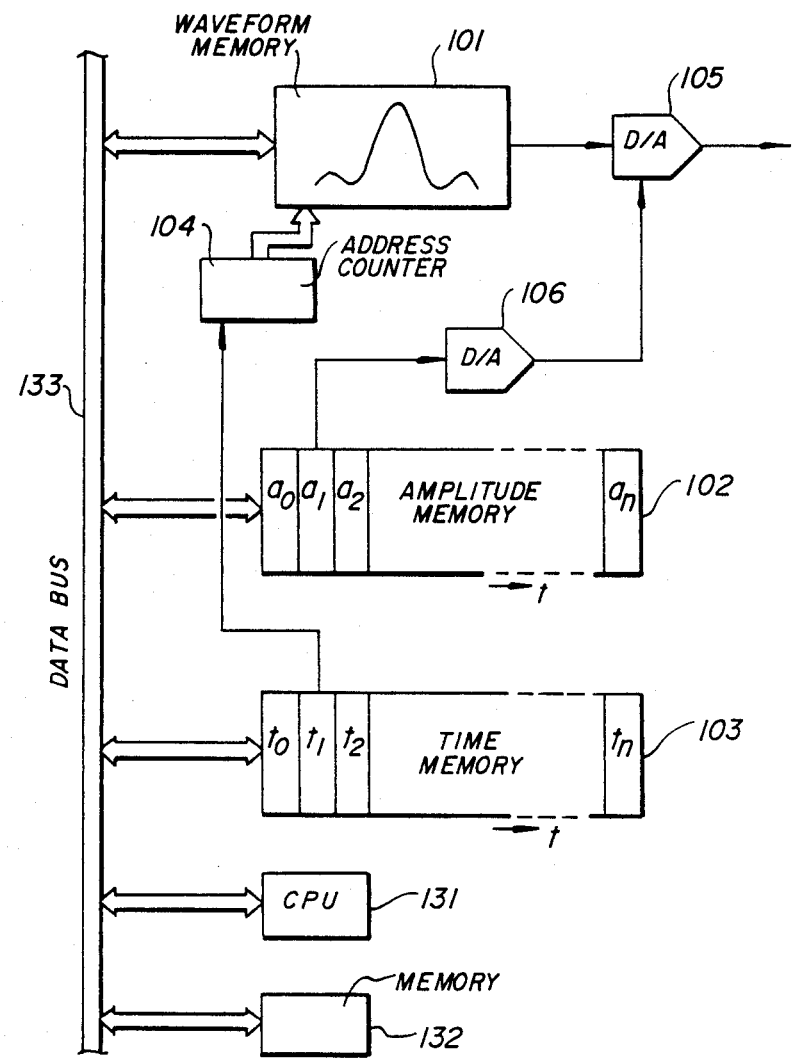
FIG. 2 is a block diagram depicting an illustrative embodiment of the invention.
Figure 3:
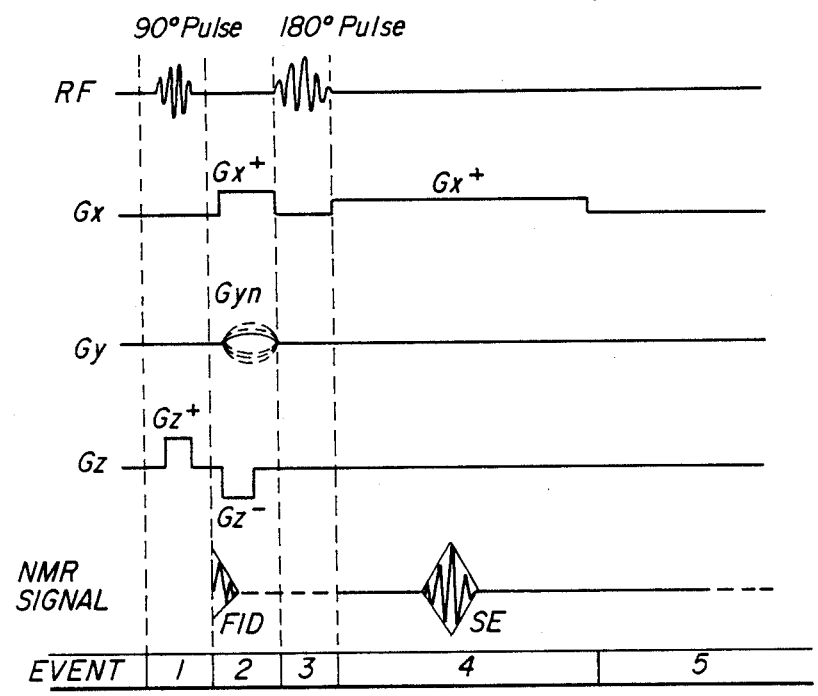
FIG. 3 is a waveform chart depicting the pulse sequence of an operation of the NMR device of FIG. 1

Sequence storage circuit 10 contains the scan controller of the invention which will be described further with reference to FIG. 2, and executes scanning in a desired sequence, such as shown in FIG. 3, through scan controller operation.

FIG. 3 shows data collection through use of scanning according to Fourier's pulse sequence, wherein RF denotes a high-frequency pulse; and $G_x$, $G_y$ and $G_z$ indicate gradient magnetic fields. The gradient magnetic field functions are divided into $G_x$ for the readout gradient, $G_y$ for the warp gradient, and $G_z$ for the slice positioning gradient. The NMR signal shows the FID signal after a 90° pulse, and the Spin Echo (SE) signal after a 120° pulse.

The sequence is divided into events (1, 2 ... n), or time slots, for which individual pulses are numbered.

In event 1, spins in the slice surfaces vertical to the z axis which is centered at z=0, are excited by a 90° pulse and a gradient magnetic field $G_z+$. The envelope of the 90° pulse is used for a sine wave function, for example.

In event 2, gradient $G_x+$, $G_{yn}$, and $G_z-$ are applied. $G_{yn}$ shifts the phase of the spin in proportion to the directional position of y through an operation called a warp, while the strength of such operation is controlled to be different for each view.

In event 3, a 180° pulse is applied. The envelope of this 180° pulse is also used for a sine wave function, for example.

In event 4, the SE signal is measured while applying gradient magnetic field $G_x+$.

As described thus far, a high-frequency pulse and gradient magnetic fields are generated and applied for each event (e.g. 1, 2 ... n) according to the control signals of specific waveforms. The control signals of these waveforms, for example, are generated by the invention scan controller shown in FIG. 2.

Figure 4:
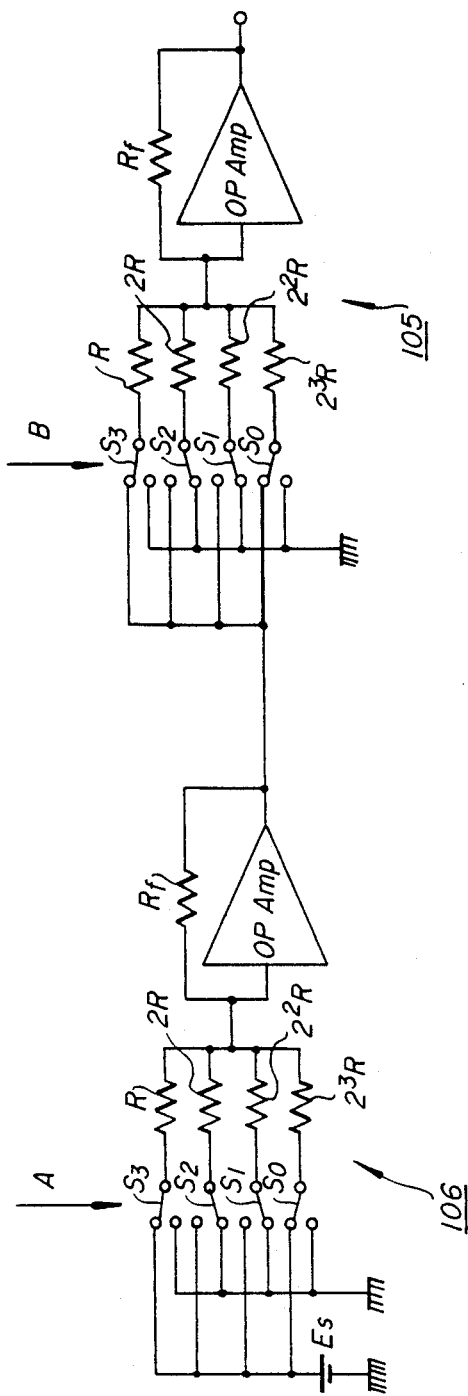
FIG. 4 is a circuit diagram of the first and second D/A converters shown in FIG. 2.

Turning now to FIG. 2, the scan controller comprises a waveform memory 101, an amplitude memory 102, a time memory 103, a central processing unit 131, a memory 132, all connected together through a data bus 133 for control by the CPU 131. Memory 132 is located in computer 13 of FIG. 1. Time memory 103 is connected to address counter 104 which is connected to waveform memory 101. The amplitude memory 102 is connected to second D/A converter 106, which is connected to the first D/A converter 105 which is connected to waveform memory 101. FIG. 4 depicts the circuitry of the D/A converter 105,106 and will be discussed later.

The waveform memory 101 stores the control signal waveform and comprises four sets of memories, one set of memories for each of the RF, $G_x$, $G_{yn}$ and $G_z$ waveforms. Although FIG. 2 depicts an RF waveform memory as a typical example, the other memories are understood to be in memory 101. The RF pulse envelope for one event is written into waveform memory 101 as a wave form comprising N steps.

The values of individual waveform steps (of the N steps) stored in waveform memory 101 are sequentially read out according to respective addresses specified by address counter 104.

To put this another way, the instantaneous values at all points of the control signal are stored in a desired sequence at a series of addresses. These stored values are read out by instruction of CPU 131 according to the addresses assigned by the address counter 103, and the addresses are incremented every predetermined cycle.

The address incrementing cycle is determined by the cycle of the clock signal applied to the address counter 104 and the clock signal is generated by the CPU 131, such as by use of appropriate software.

The time required for reading out the complete waveform of the control signal is determined by the product of the number of addresses at which all of the instantaneous values of the control signal are stored and the cycle of the clock signal.

The product of the two factors represents the duration of the control signal. Since the number of addresses at which all of the instantaneous values of the control signal is fixed, it is possible to change the duration of the control signal by changing the cycle of the clock signal. That is, where the control signal duration is desired to be short, the cycle of the clock signal is shortened and where the control signal duration is desired to be long, the cycle of the clock signal is lengthened.

Address counter 104 comprises four sets of address counters, each corresponding to respective ones of the four sets of memories of waveform memory 101, such as for the RF, $G_x$, $G_{yn}$ and $G_z$ waveforms. Digital data read out from waveform memory 101 is applied to first D/A converter 105 which then converts digital data into an output analog signal which is used as the control signal for the NMR imaging device. As will be seen from the below discussion, with the D/A conversion, a signal outputted from the second D/A converter 106 will be used as a base level signal so that the outputted control signal from first D/A converter 105 has amplitude values based on the amplitudes stored in amplitude memory 102.

Amplitude memory 102 is provided to store the amplitudes of the control signals in the form of a multiplicance in the order of events. The multiplying factor of amplitude includes a zero value and a negative value. Amplitude memory 102 also comprises four sets of memories, each corresponding to a respective one of the four sets of waveform memories. Digital data read out from the amplitude memory 102 is applied to second D/A converter 106 which converts the digital data into an analog signal which is then applied to the first D/A converter 105 as its base level signal (such as shown as $E_s$ for second D/A converter 106 in FIG. 4) so that a desired amplitude level is assigned to the analog output from the first D/A converter 105. Consequently, the value of the output signal from the first D/A converter 105 becomes equal to the product of the multiplying of the value of the signal stored in waveform memory 101 by the value of the signal stored in amplitude memory 102.

In another embodiment, these two values of signals stored in the waveform memory 101 and the amplitude memory 102 are multiplied by each other when in the digital signal stage, and then the product subsequently converted into an analog signal.

Time memory 103 stores data for assigning the cycle of the clock signal, in the order of the events. CPU 131 reads out the data from the time memory 103 each time the event (e.g. 1 ... n) changes, and generates, through use of appropriate software, a clock signal having a cycle assigned by the data in time memory 103 and applies the clock signal to address counter 104 through the duration of the event. In FIC. 2, such relationship between time memory 103 and address count 104 is represented by a line connecting the two components.

The time memory 103 also stores data which defines the duration of one waveform stored in waveform memory 101 or the duration of the control signal for one event, in the order of the event. Time memory 103 stores data representing the cycle of the clock signal which is inputted to address counter 104. Data representing a short clock cycle is stored in time memory 103 for a control signal of a short duration, while data representing a long clock cycle is stored in time memory 103 for a control signal with a long duration.

FIG. 4 depicts the circuitry of the first and second D/A converters 105,106. These circuits are well known and need no further description of structure or function. The value of signals stored in waveform memory 101 is taken in digital form and applied at B to $S_3 \ldots S_0$ of D/A converter 105. Similarly, the value of signals stored in amplitude memory 102 is taken and applied in digital form at A to $S_3 \ldots S_0$ of D/A converter 106. $E_s$ of D/A converter 106 provides a base level against which digital data from amplitude memory 102 is multiplied and the output of OP amplifier of D/A converter 106 is applied as what would be $E_s$ to first D/A converter 105 so as to provide a base level against which digital data from the waveform memory 101 is multiplied and converted to analog signal. As is known, the output signal from a D/A converter is proportion to the product of the value of the input digital signals applied to $S_3 \ldots S_0$ and signal $E_s$.

Assume that the first digital value of signals stored in the waveform memory 101 which is applied to the first D/A converter 105 is ($b_3'$, $b_2'$, $b_1'$, $b_0'$) and the second digital value of signals stored in the amplitude memory 102 which is applied to the second D/A converter 106 is ($b_3$, $b_2$, $b_1$, $b_0$); then, the value of the analog signal output voltage $V_o$ of D/A converter 105 is determined by the following equation:

$$V_o = \left(\frac{R_f}{R}\right)^2 E_s(b_3 \cdot 2^0 + b_2 \cdot 2^{-1} + b_1 \cdot 2^{-2} + b_0 \cdot 2^{-3}) \cdot$$

$$(b_3' \cdot 2^0 + b_2' \cdot 2^{-1} + b_1' \cdot 2^{-2} + b_0' \cdot 2^{-3})$$

In other words, the digital data obtained from the value of the signals stored in the amplitude memory 102 is converted from digital to analog in D/A converter 106. That analog signal from D/A converter 106 is applied as $E_s$ to D/A converter 105, which is making a D/A conversion of the digital signal from waveform memory 101 to an analog signal. Thus, there is a multiplication of the two stored values and a conversion of digital to analog.

The contents of memories 101, 102, and 103 can be readily accessed and reloaded by CPU 131. The data stored in amplitude memory 102 and time memory 103 are simultaneously read out by CPU 131 during the same event number (see FIG. 3) which is provided by CPU 131. The event number is incremented by one each time an event is terminated.

In this embodiment, the four sets of waveform memories in waveform memory 101 stores the waveform for one event for each of RF, $G_x$, $G_{yn}$, and $G_z$ and is used in the sequence shown in FIG. 3. The four sets of amplitude memories of amplitude memory 102 store the amplitude multiplying factors for events of the individual signals. Time memory 103 stores data for the clock cycles to read data from the respective four sets of waveform memories in waveform memory 101 for the individual events. The sequence shown in FIG. 3 is executed by CPU 131, which consecutively updates the event number at a specific timing.

The scan controller of the invention has the following advantages and features. The amplitude and duration of the control signals are stored respectively in amplitude memory 102 and time memory 103. Thus, the control signal to be stored in waveform memory may be of any type, regardless of its amplitude and duration, or number of events, as long as the waveform is the same. This largely reduces the number and capacity of memories used to store the control signals Because the control signal is the product of the value of the signal stored in waveform memory 101 multiplied by the value of the signal stored in amplitude memory 103, the number of control signal bits is the sum of both stored values. Thus, a control signal output having high amplitude resolution is obtained without increasing the number of bits for the value of the signal stored in waveform memory 101. If it is desired to execute other sequences using the same waveform, advantageously, only the contents of the amplitude memory 102 and time memory 103 need be reloaded. If it is desired to execute a sequence using another waveform, the loaded waveform of waveform memory 101 should be reloaded or the required waveform should be selected from a plurality of preloaded waveforms. Therefore, operational sequences can be advantageously randomly and easily assembled.

The ideal mode for the embodiment of the invention is illustrative and not restrictive, and the scope of the invention indicated by appended claims and all variations within the meaning of such claims can be easily determined by those possessing knowledge in the technical fields to which this invention applies.

What is claimed is:

1. A scan controller for use in an NMR imaging device to control high frequency pulses and/or gradient magnetic fields, said controller comprising waveform memory means for storing control signal waveforms;

amplitude memory means for storing control signal amplitudes;

time memory means for storing control signal durations;

central processing means for causing the reading out of said waveform memory means, said amplitude memory means, and said time memory means;

address counter for assigning addresses to parts of said waveform in said waveform memory means as related to a cycle represented by values read out from said time memory means, so that said central processing means reads out from said waveform memory means and said amplitude memory means values of signals stored therein in a specified order of events; and means for multiplying the read out values from said amplitude memory means and the read out values from said waveform memory means and for producing an output signal representing the multiplied product with a value representing the amplitude of the control signal stored in said amplitude memory means.

2. The controller of claim 1, wherein said address counter counts clock signals received from said central processing means.

3. The controller of claim 1, wherein said means for multiplying comprises a first digital to analog converter for converting the read out values from said waveform memory means to an analog signal; and a second digital to analog converter for converting the read out values from said amplitude memory means into an analog signal; and wherein said analog signal from said second digital to analog converter is applied as a base level input signal to said first digital to analog converter so that the analog signal from said first digital to analog converter represents the product of the multiplication of the read out values from the waveform memory means and the read out values from the amplitude memory means.

4. The controller of claim 1, wherein said output signal from said means for multiplying is an analog signal.

* * * * *